United States Patent
Horiuchi et al.

(10) Patent No.: US 6,690,060 B2
(45) Date of Patent: Feb. 10, 2004

(54) FIELD EFFECT TRANSISTOR AND METHOD OF FABRICATING THE SAME BY CONTROLLING DISTRIBUTION CONDITION OF IMPURITY REGION WITH IMPLANTATION OF ADDITIONAL ION

(75) Inventors: Masatada Horiuchi, Koganei (JP); Takashi Takahama, Higashimurayama (JP)

(73) Assignees: Hitachi, Ltd., Tokyo (JP); Hitachi, ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 09/907,714

(22) Filed: Jul. 19, 2001

(65) Prior Publication Data

US 2002/0024078 A1 Feb. 28, 2002

(30) Foreign Application Priority Data

Aug. 24, 2000 (JP) ........................................ 2000-259369

(51) Int. Cl.$^7$ ............................................. H01L 29/772
(52) U.S. Cl. ........................................ 257/327; 257/345
(58) Field of Search ................................ 257/408, 327, 257/336, 337, 338, 344, 345

(56) References Cited

U.S. PATENT DOCUMENTS

| | | | |
|---|---|---|---|
| 4,729,001 A | * | 3/1988 | Haskell |
| 4,746,964 A | * | 5/1988 | Aronowitz |
| 5,525,529 A | * | 6/1996 | Guldi |
| 6,174,778 B1 | * | 1/2001 | Chen et al. |

FOREIGN PATENT DOCUMENTS

| | | |
|---|---|---|
| JP | 2-114633 | 4/1990 |
| JP | 11-87706 | 3/1999 |

OTHER PUBLICATIONS

Codella, "Field Effect Transistor with Asymmetrical Structure," US Statutory Invention Registration H986, Nov. 5, 1991.*
Streetman, "Solid State Electronic Devices," 1990, Prentice–Hall, third ed., p. 350–351.*

* cited by examiner

Primary Examiner—Nathan J. Flynn
Assistant Examiner—Kevin Quinto
(74) Attorney, Agent, or Firm—Mattingly, Stanger & Malur, P.C.

(57) ABSTRACT

A first object of the present invention is to provide an insulated gate field effect transistor which realizes reductions in the junction depth and the resistance of source and drain junction regions beneath a gate electrode. Another object is to provide a miniaturized complementary type insulated gate field effect transistor capable of achieving a large current and a high operation speed. In a miniaturized MOS transistor, a low concentration impurity integrated layer comprising In or Ga is provided so as to have a peak in the inside of high concentration shallow source and drain diffusion layer regions. By this arrangement, the shallow source and drain diffusion layers are attracted by the impurity integrated layer, to realize shallower junctions having a high concentration and a rectangular distribution. As a result, particularly, a miniaturized PMOS with a larger current, punch-through hard and an ultra miniaturized configuration is achieved, and this can be applied also to NMOS, and, therefore, a CMOS with a larger current, punch-through hard and a more miniaturized configuration can be achieved without complicating the fabrication steps, namely, economically.

10 Claims, 6 Drawing Sheets

FIELD EFFECT TRANSISTOR AND METHOD OF FABRICATING THE SAME BY CONTROLLING DISTRIBUTION CONDITION OF IMPURITY REGION WITH IMPLANTATION OF ADDITIONAL ION

BACKGROUND OF THE INVENTION

1. Field of the Invention

The present invention relates to a method of fabricating a semiconductor device, and particularly to realization of a super miniaturized insulated gate field effect transistor with a larger current and a superhigh operation speed.

2. Description of the Related Art

Enhancement of performance of insulated gate field effect transistors constituting an ultrahigh-density integrated circuit device (hereinafter referred to simply as "MOS") has been achieved by reducing transistor area and gate size so as to attain the merits of reduction in power supply voltage used and reduction in parasitic capacitance according to the scaling rule. At present, super miniaturized MOSs with a gate length of not more than 160 nm have also been put to practical use. In these super miniaturized MOSs, reduction of the source and drain junction depth has also been tried attending on the reduction in the gate length, and a shallow junction depth of not more than 30 nm has been attained at present. In reducing the source and drain junction depth, reduction of the resistance of a source diffusion layer is essential to realization of a large current while restraining the so-called short channel effect, namely, an abrupt lowering of threshold voltage attendant on the reduction of the gate length.

Figure 2:
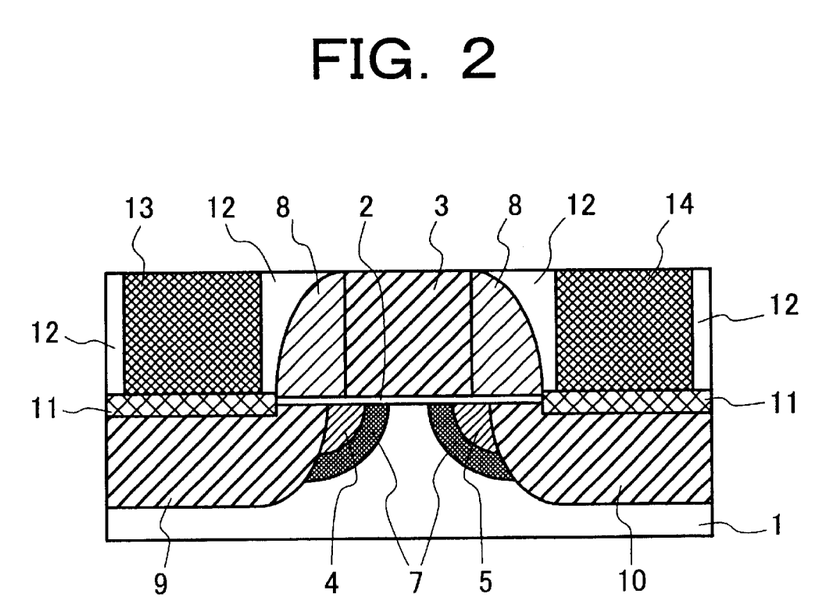
FIG. 2 is a sectional view of a MOS type field effect transistor according to the prior art.
Figure 3:
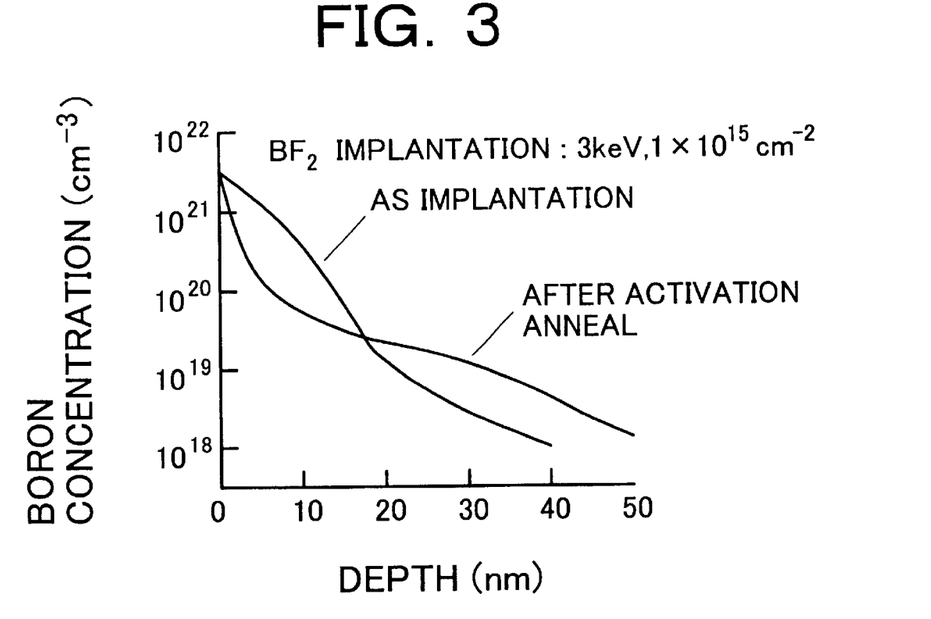
FIG. 3 is a diagram showing impurity distribution in the depth direction from the surface of a semiconductor substrate in shallow source and drain junctions according to the prior art.

FIG. 2 is a sectional view schematically showing a conventional super miniaturized MOS, and FIG. 3 shows an impurity distribution in the depth direction in high concentration source and drain shallow junctions 4, 5 (called "extension") in FIG. 2. In FIG. 2, in the case of an N conductive type MOS, a gate insulation film 2 is provided on the surface of a P conductive type Si substrate 1, and a gate electrode 3 is provided thereon. N conductive type source and drain shallow junction diffusion layers 4, 5 and so-called pocket diffusion layer regions 7 which are high concentration P conductive type impurity diffusion layers for preventing the so-called short channel effect are introduced by using the gate electrode 3 as an implantation mask. Further, source and drain diffusion layers 9, 10 of N conductive type and deep junction are introduced by using a gate side wall insulation film 8 as an implantation mask. In the figure, numeral 11 denotes a silicide film, 12 a surface protective insulation film, 13 a source electrode, and 14 denotes a drain electrode.

The source and drain shallow junction diffusion layers are fabricated conventionally by the following steps. (1) A high concentration impurity is introduced by low acceleration energy ion implantation using the gate electrode as an implantation(screen) mask; (2) then, the pocket regions are provided by ion implantation; (3) further, the source and drain diffusion layers of deep junction are provided by ion implantation using the gate electrode side wall insulation film as a mask; and (4) thereafter, activation of the implanted ions is carried out by a high-temperature short-period annealing method. The short-period anneal is adopted in order to achieve the activation while retaining the steep impurity distribution obtained upon ion implantation, through minimizing the spreading of junction depth due to thermal diffusion of implanted impurities.

However, further reductions in the junction depth and the resistance of the diffusion layers cannot be achieved by only the short period annealing at high temperature. A principal reason is based on the so-called transient enhanced diffusion phenomenon, namely, enhanced diffusion under a relatively low temperature condition of not more than 900° C. due to the presence of interstitial Si and vacancies generated upon ion implantation. The generation of the interstitial Si and vacancies is inevitable also in the subsequent ion implantation for forming the deep source and drain regions, and enhanced diffusion in the shallow junction regions is further augmented. The generation of interstitial Si is seen also in a thermal oxidation step, and is called oxidation enhanced diffusion phenomenon, so that it is very difficult to restrain the enhanced diffusion phenomenon in the subsequent steps.

FIG. 3 shows the results of measurement by secondary ion mass spectrometry of impurity distribution in the range from the surface to the inside of a substrate upon ion implantation of boron (B) into an Si single crystal substrate at an acceleration energy of 3 keV and a dose of $1 \times 10^{15}/cm^2$ and after a short anneal at 1000° C. for 10 sec. As is clear from the figure, a tailing phenomenon of the impurity distribution is observed in spite of the low acceleration energy implantation, and it is very difficult to form a shallow junction even with the short period anneal. It is also apparent that impurity concentration gradually and monotonously decreases from the surface toward the depth direction, in other regions than the vicinity of the surface. Namely, the impurity distribution shape obtained at present is far from the rectangular distribution shape with a high concentration of $10^{20}/cm^3$, which is considered to be an ideal impurity distribution for realizing a low diffusion layer resistance while maintaining a shallow junction.

Therefore, in order to achieve a small size and a larger current with a miniaturized MOS, realization of an optimum impurity distribution offering both shallower junction and lower resistance to the present source and drain junctions is indispensable.

As another phenomenon hampering the provision of source and drain extension junctions with shallow junction and high concentration rectangular distribution, there is known the so-called channeling phenomenon in which implanted ions pass through more than the penetration distance determined by the acceleration energy, because the Si crystal lattice spacing depends on the crystal orientation. In order to prevent the spreading of the impurity concentration distribution due to the channeling phenomenon, there have been known slant angled ion implantation and implantation of a large amount of an ion neutral to Si such as Ge to preliminarily amorphousize the surface region, thereby preventing the channeling phenomenon at the time of ion implantation for forming extension junctions. However, the ion implantation for amorphousizing is also attended by the generation of interstitial Si and vacancies, and it is difficult to realize the formation of an ideal shallow junction. Further, in recrystallization of an amorphousized region by heat treatment, recovery to a perfect crystal is difficult, and a junction formed in the region is affected by crystalline defects nonnegligibly and is attended by generation of junction leakage current.

A technique of using In as a means for preventing the channeling phenomenon is seen in Japanese Patent Laid-Open No. Hei 11-87706. In the publication, the following procedure is adopted: (1) In is implanted though the entire surface of an active region of an N channel MOS transistor (referred to as NMOS) or by using a gate electrode as a mask to achieve amorphousizing; (2) As ion is implanted to form extension junctions; (3) P ion is implanted to form deep source and drain diffusion layers; and (4) heat treatment is carried out for activation of introduced impurities. The purpose of the above technique is to form the deep source and drain diffusion layers to be shallower layers by utilizing the phenomenon of attraction of P by In through setting the implantation penetrate distance of In at a depth between the extension junction and the deep source and drain diffusion layers. Namely, in the above technique, amorphousizing and the phenomenon of attraction of P by In are used for obtaining shallower junctions. Incidentally, according to the description of the above technique, activation coefficient is higher with P than with As, and As is smaller than P in mass; however, this is contrary to the fact, and As ion implantation is ordinarily used also for formation of deep source and drain diffusion layers.

Another technique of applying the phenomenon of mutual attraction of implanted impurities to control of junction is described in Japanese Patent Laid-Open No. Hei 2-114633. In this technique, after Ga is implanted into a surface region, B is implanted with a deeper penetrated distance as compared with Ga, and thereafter heat treatment is carried out to utilize the mutual attraction of Ga and B for forming a shallower P type diffusion layer as compared with the case of singly using B.

A problem to be solved by the present invention is to achieve both shallower junction in source and drain extension junction regions beneath a gate electrode so as to perfectly cut off a source-drain punch-through current path and an impurity distribution capable of extreme reduction of diffusion resistance through a rectangular distribution with a high impurity concentration of not less than $10^{20}/cm^3$, in obtaining a miniaturized MOS with higher performance, namely, a larger current. Another problem to be solved by the invention is to realize the above impurity distribution structure not only with a P channel MOS transistor (referred to as PMOS) constituted in an N type substrate region but also with a complementary MOS transistor (referred to as CMOS) having an N type region and a P type region in the same semiconductor substrate and having NMOS and PMOS in the N type and P type regions, and to realize an ultra miniaturized MOS capable of providing an ultra miniaturized CMOS with a larger current and higher operation speed.

Incidentally, the term MOS herein is used as an abbreviation for a general insulated gate field effect transistor. Accordingly, in the present invention, the gate insulation film includes not only an oxide film, particularly an Si oxide film, in accordance with the etymology of MOS, but also other films, for example, a nitride film or a composite film of an oxide and other substance.

A further problem to be solved by the invention is to dissolve the disadvantages generated in the prior art of controlling a P diffusion layer by mutual reaction with In. The disadvantages include, for example, bad effects on junction characteristics of amorphousizing or generation of crystal defects by ion implantation of In having a large mass, and an increase of junction leakage current.

Namely, in the prior art, deep source and drain diffusion layers using P are formed so as to outrun an In implanted region, so that the deep source and drain diffusion layers inevitably intersect with the In implanted region at least at a region. Therefore, there has been the difficulty that it is impossible to avoid influence of junction failure at the location of intersection.

A further problem to be solved by the invention is to reduce the junction depth and resistance of extension junction regions most sensitive to realization of a miniaturized MOS with a larger current, as contrasted to the prior art in which the problem is set to be to reduce junction depth of deep source and drain diffusion layers contributing little to realization of a miniaturized MOS with a larger current.

A still further problem to be solved by the invention is to find out an element having the same B-attracting action as Ga and not having the disadvantages of Ga, to realize an extension junction with an extremely steep impurity distribution and low resistance and to thereby achieve a miniaturized MOS with higher performance. The disadvantages of Ga include, for example, (1) that Ga has a small mass and it is difficult to realize a steep distribution in an Si crystal substrate by an ion implantation method, and (2) that Ga is easily diffused outward by an ordinary heat treatment step, and has a high diffusion rate and low activation coefficient, so that it is difficult to obtain a lower resistance and a shallower junction.

SUMMARY OF THE INVENTION

Main modes of the present invention will be enumerated as follows.

A first mode of the present invention resides in an insulated gate field effect transistor comprising a PN junction at a portion of a main surface region of a semiconductor substrate of a first conductive type, the PN junction formed by a high concentration impurity region of a second conductive type demarcated by a deep junction and a shallow junction, the high concentration impurity region so constituted as to have a maximum concentration at the surface of the semiconductor substrate, and a second impurity region distributed in the inside of the high concentration region of a first impurity constituting the shallow junction region of the second conductive type, the second impurity region having a maximum concentration in the inside of the semiconductor and having a maximum concentration lower than the maximum impurity concentration of the high concentration region of the first impurity.

The maximum concentration of the first impurity region constituting the shallow junction region is preferably not less than $1 \times 10^{20}$ cm$^{-3}$, and the maximum impurity concentration of the second impurity region is preferably not more than $5 \times 10^{19}$ cm$^{-3}$.

A second mode of the present invention resides in an insulated gate field effect transistor wherein a first conductive type region and a second conductive type region are provided at main surface portions of the same semiconductor substrate, a first insulated gate field effect transistor comprising a PN junction formed by a high concentration impurity region of a second conductive type demarcated by a deep junction and a shallow junction is provided in the first conductive type region, whereas a second insulated gate field effect transistor comprising a PN junction formed by a high concentration impurity region of a first conductive type demarcated by a deep junction and a shallow junction is provided in the second conductive type region, and a second impurity region having a maximum concentration in the inside of the semiconductor substrate is provided in the high concentration impurity region of the second conductive type constituting the shallow junction and in the high concentration impurity region of the first conductive type. The maximum impurity concentration of the first and second conductive type high concentration impurity regions constituting the shallow junction regions is preferably not less than $1 \times 10^{20}$ cm$^{-3}$, and the maximum impurity concentration of the second impurity region is preferably not more than $5 \times 10^{19}$ cm$^{-3}$.

A representative example of the impurity constituting the second impurity region is In.

The high concentration impurity regions of the first and second conductive types constituting the shallow junction regions are preferably constituted of As and B.

A third mode of the present invention resides in a method of fabricating an insulated gate field effect transistor comprising the steps of: forming a gate electrode; introducing a first impurity of a second conductive type so as to obtain a maximum impurity concentration at a main surface of a semiconductor substrate by using an end of the gate electrode as an introduction boundary; and introducing a second impurity region of the second conductive type so as to obtain a maximum impurity concentration in the first impurity introduction region in the semiconductor substrate.

A fourth mode of the present invention resides in a method of fabricating an insulated gate field effect transistor, comprising the steps of: forming a gate electrode on a main surface of each of a first conductive type region and a second conductive type region formed in main surface regions of a semiconductor substrate, with a gate insulation film therebetween; selectively introducing a second conductive type high concentration impurity into the first conductive type region and a first conductive type high concentration impurity into the second conductive type region by using each of ends of the gate electrodes as an introduction boundary; and introducing a second conductive type impurity different from the second conductive type high concentration impurity.

Further modes of the present invention will be described in detail below in the description of embodiments of the invention.

DETAILED DESCRIPTION OF THE INVENTION

From the viewpoint of pursuing MOS characteristics with a larger current, in the MOS based on the present invention, reduction of thickness of a gate insulation film and reduction of gate length are carried out based on scaling rule together with a power supplied voltage used. Therefore, a structure is adopted wherein an effective channel length basically determining current-voltage characteristics is determined by gate processing technique to which limit technology of refining is applied and by source and drain diffusion layers formed by using a gate electrode as an ion implantation mask. In providing the diffusion layers, ion implantation conditions for fulfilling the shallow junction and high concentration conditions in order to sufficiently restrain the punch-through phenomenon between the source and the drain and to minimize source resistance as much as possible and a step of alleviating the subsequent thermal budget are adopted.

Before describing embodiments of the present invention, a fact constituting the essence of the present invention will be described.

The fundamental concept of the present invention is based on the finding that impurity diffusion profiles of B, As and the like preliminarily introduced are largely changed by introduction of In, during the study of diffusion phenomenon of In of the P conductive type which is ion-implanted into an Si single crystal substrate.

Namely, As ion was implanted at an acceleration energy of 5 keV and a dose of $2 \times 10^{15}/cm^2$ into the surface of an Si single crystal substrate of a plane orientation (100) provided with a surface protective oxide film with a thickness of 2.5 nm, then In ion was implanted, and a heat treatment for activation of implanted ions was carried out at a high temperature of 1000° C. for a short period of 10 sec. In implantation of In ion, the acceleration energy was 200 keV and the dose was varied in the range of $1 \times 10^{12}/cm^2$ to $1 \times 10^{15}/cm^2$ as a parameter. Then, before and after the ion activation heat treatment, depth profile of impurity of As and In impurities in each specimen was measured by secondary ion mass spectrometry.

As a result, the maximum impurity concentration of As before the activation heat treatment was $2.5 \times 10^{21}/cm^3$ at the surface of the Si substrate, while In had its maximum impurity concentration at a depth of about 95 nm from the Si substrate surface. The maximum impurity concentration of In was $6.5 \times 10^{17}/cm^3$ and $6.5 \times 10^{18}/cm^3$ under the implantation conditions of $1 \times 10^{13}/cm^2$ and $1 \times 10^{14}/cm^2$, respectively.

On the other hand, impurity distribution after the activation heat treatment showed an extremely peculiar profile.

Namely, As showed an enhanced diffusion phenomenon, from a high concentration region of not less than $10^{20}/cm^3$ to a low concentration region of not more than $10^{17}/cm^3$, as if parallel movement occurred in the direction of the maximum concentration depth position of In with an increase of In dose. The junction depth in the case of a substrate impurity concentration of $1\times10^{18}/cm^3$ was 42 nm, 72 nm and 73 nm in specimens with In doses of $1\times10^{13}/cm^2$, $5\times10^{13}/cm^2$ and $1\times10^{14}/cm^2$, respectively. The enhanced diffusion was observed conspicuously at an In dose of not less than $1\times10^{13}/cm^2$. The above phenomenon means that not less than 100 As atoms underwent enhanced diffusion by one In atom, which is a peculiar phenomenon far beyond the common sense as to the conventional enhanced diffusion.

Depth profile of In after the activation heat treatment also showed a peculiar behavior. Maximal impurity points are formed on both sides of a maximum concentration region before the activation heat treatment. One of the maximal impurity points is located at the high concentration As impurity region, and the other is located somewhat deeper than the maximum concentration point before the activation heat treatment, namely, in the vicinity of a depth of 140 nm, and the maximum impurity concentration state before the heat treatment vanishes. When the section of the specimen was observed under a transmission (type) electron microscope, the presence of a secondary crystal defect in the vicinity of a maximal point of In impurity concentration was confirmed. From the results of the observation, it was inferred that the enhanced diffusion upon In ion implantation arises from the crystal defect due to In.

Based on the above experimental results, enhanced diffusion phenomenon of As was studied by setting the acceleration energy for In ion implantation at 10 keV. The As ion implantation conditions and heat treatment conditions were the same as in the above experiment. The penetration depth under the above In implantation conditions is about 10 nm. When depth direction concentration distribution of As was measured, it was found that junction depth at a substrate impurity concentration of $1\times10^{18}/cm^3$ was about 25 nm, similar to that in the impurity concentration distribution before the activation heat treatment, and an extremely steep depth direction distribution was obtained without any trailing at or below $1\times10^{18}/cm^3$.

Figure 4:
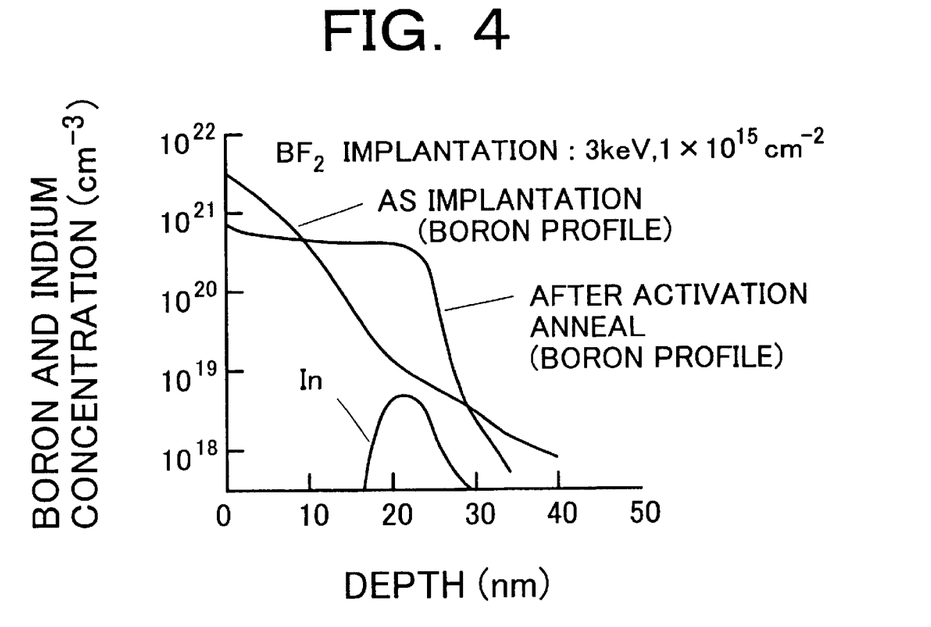
FIG. 4 is a diagram showing impurity distribution in the depth direction from the surface of a semiconductor substrate in shallow source and drain junctions according to the present invention.

The interaction of In with other impurities was studied, and the results are shown in FIG. 4. The figure shows enhanced diffusion of B by In, before and after an activation heat treatment at 1000° C. for 10 sec. The introduction of B was carried out under $BF_2$ ion implantation conditions of an acceleration energy of 3 keV and a dose of $1\times10^{15}/cm^2$, whereas In ion was implanted at an acceleration energy of 35 keV and a dose of $1\times10^{13}/cm^2$. As shown in the figure, In had a maximum concentration of $6\times10^{18}/cm^3$ at a depth of about 22 nm from the substrate surface, while B had a uniform distribution at a high concentration of not less than $10^{20}/cm^3$ from the surface to a depth of about 25 nm, from which the B concentration decreased with a steep concentration gradient.

The concentration distribution of B in FIG. 4 shows that it is possible to obtain an impurity distribution shape quite different from the depth direction distribution of B based on the conventional method under the same heat treatment conditions without In ion implantation shown in FIG. 3. Namely, the above experimental results as to the interaction of B and As with In shows that, by controlling the implanted region of In, it is possible to control the distribution condition of impurity atoms in an amount of not less than 100 times the In dose within an arbitrary depth region. It is understood that the impurity atoms of which the distribution condition is controlled (in this case, As or B) may be of any conductive type.

In connection with the interaction between In and other impurities, the interaction between P and In hitherto known was also studied. As a result, a high impurity concentration region of P showed no change, and the behavior was not so conspicuous as the movement of impurity distribution of As and B. Upon introduction of In, a minor change such as a movement of a low concentration distribution region of P was observed.

By application of the above phenomenon newly found out to source and drain junctions in a miniaturized MOS, it is possible to improve the monotonous decrease distribution of impurity concentration in conventional extension junctions of B shown in FIG. 3 to a roughly rectangular impurity distribution at a constant high concentration from the surface to the vicinity of a desired junction depth.

Also in the case of an As extension junction, by setting the implantation penetration depth of In at a shallower junction position, it is possible to provide a junction with a more clearly rectangular high concentration distribution shape, as compared to those in the prior art. Here, In is of opposite conductive type, so that it compensates the N conductive type carrier concentration and acts in the direction of increasing the sheet resistance; however, because not less than 100 As atoms are integrated by one In atom, the effective carrier concentration is increased. Therefore, this region provides an extremely shallow junction having a low sheet resistance. Namely, based on the above-mentioned means, it is possible to provide minimization of source and drain internal resistances indispensable to obtaining a larger current, particularly, a reduction of resistance of extension junction regions disposed beneath a gate electrode, while restraining the short channel effect based on the punch-through phenomenon in super miniaturized CMOS.

Although a possibility of applying the known interaction of Al or Ga with B to enhancement of performance of a P type extension junction may be considered, it is difficult for Al and Ga to take the role of In according to the present invention, for the following reasons. Namely, (1) Al and Ga are smaller than In in mass, so that it is in principle difficult to set a steep concentration distribution at an arbitrary depth by ion implantation; (2) Al and Ga are diffused in an Si substrate at such a high speed that it is difficult to control the diffusion by ordinary fabrication steps for a semiconductor device; and (3) Al and Ga are extremely low in activation coefficient as an acceptor impurity and cannot be put to practical use in consideration of application to miniaturized MOS.

Now, the present invention will be described more in detail by way of embodiments. For easy understanding, the embodiments will be described referring to drawings, in which major parts are shown enlargedly as compared with other parts. The material, conductive type, fabrication conditions and the like of each part are not limited to the description of the embodiments, and various modifications can naturally be made.

Embodiment 1

Figure 1:
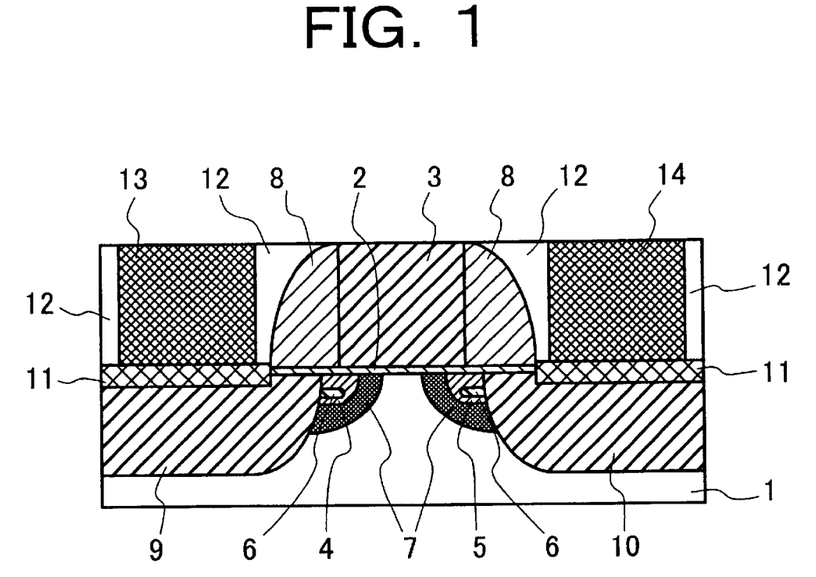
FIG. 1 is a sectional view of a MOS type field effect transistor according to a first embodiment of the present invention.
Figure 5:
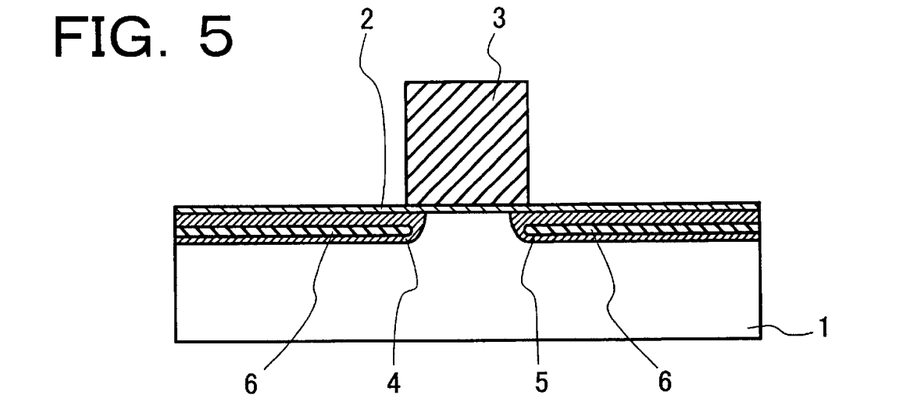
FIG. 5 is a sectional view showing a fabrication step of a MOS type field effect transistor according to the first embodiment of the present invention.
Figure 6:
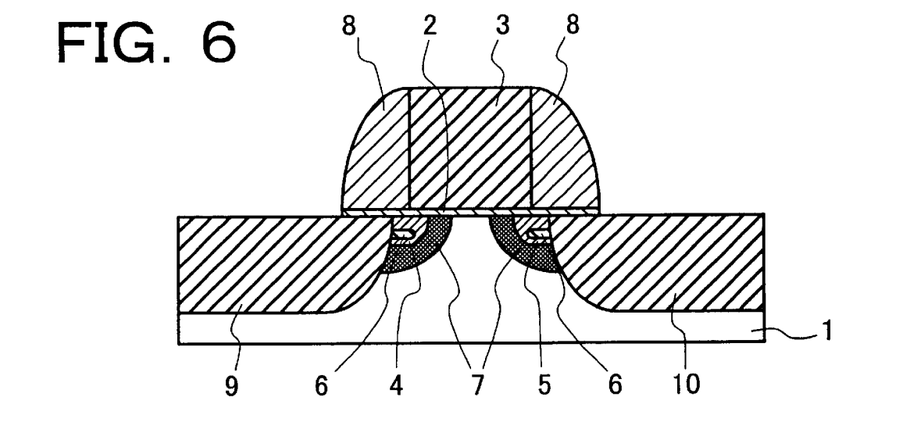
FIG. 6 is a sectional view showing a fabrication step of the MOS type field effect transistor according to the first embodiment of the present invention.

FIG. 1 is a sectional view of a completed MOS according to a first embodiment of the present invention, and FIGS. 5 and 6 are sectional views of the device showing fabrication steps.

Device separating insulation regions (not shown) for defining active regions are provided on a semiconductor substrate 1 consisting of single crystal Si of N conductive type having a plane orientation (100) and a diameter of 20 cm. Next, an N conductive type ion for adjusting substrate concentration is implanted, followed by a heat treatment for extending the implanted ion, then an ion for adjusting a threshold voltage is implanted, and a heat treatment for activation of the implanted ion is carried out by an ordinary technique. Thereafter, a thermal oxide film is formed in a thickness of 1.8 nm. The surface of the thermal oxide film was nitrided by NO gas to stack a nitride film with a thickness of 0.2 nm, thereby obtaining a gate insulation film 2. Subsequently, an amorphous Si film doped with B at a high concentration is deposited on the gate insulation film 2 in a thickness of 250 nm by a chemical vapor deposition method. These films were processed by electron beam lithography to obtain a 100 nm length gate electrode 3.

The reduction of resistance of the gate electrode 3 is not limited to the preliminary addition of impurity. Namely, phosphorus or boron may be ion implanted at a high concentration selectively into a desired gate electrode region, based on a conventional fabrication method for complementary MOS.

After the formation of the gate electrode 3, $BF_2$ ion was implanted from a normal direction under the conditions of an acceleration energy of 3 keV and a dose of $1\times10^{15}/cm^2$, thereby forming a shallow source diffusion layer 4 and a shallow drain diffusion layer 5. Subsequently, In ion was implanted at an acceleration energy of 10 keV and a dose of $2\times10^{12}/cm^2$, to provide impurity attraction regions 6.

The maximum impurity concentration of In under the above conditions was located at a depth of about 10 nm from the surface of the Si substrate, and was $2\times10^{19}/cm^3$. The maximum impurity concentration of B was about $4\times10^{20}/cm^3$ to $5\times10^{20}/cm^3$ at the surface of the Si substrate. These were confirmed by separately producing a specimen with the same specifications as above and analyzing the specimen by secondary ion mass spectrometry. The maximum concentration depth of In was located in the inside of the shallow source diffusion layer 4 and the shallow drain diffusion layer 5.

After the formation of the impurity attraction regions 6, a heat treatment was carried out under the conditions of 950° C. and 5 sec, thereby activating the implanted impurities. The heat treatment may be carried out before implantation of In. This condition is shown in the sectional view of FIG. 5.

Into the semiconductor substrate thus prepared shown in FIG. 5, P ion was implanted so as to surround the shallow source diffusion layer 4 and the shallow drain diffusion layer 5, thereby forming N conductive type punch-through stopping diffusion layers 7 for prevention of punch-through. Next, a 50 nm thick silicon oxide film was deposited on the whole surface by a plasma assisted deposited method at a low temperature of 400° C. The silicon oxide film was selectively left at side wall portions of the gate electrode 3 by anisotropic dry etching, to provide a gate side wall insulation film 8.

With the gate side wall insulation film 8 as an ion implantation mask region, a P type high concentration drain diffusion layer 10 and a P type high concentration source diffusion layer 9 were formed by ion implantation. The implantation conditions of the $BF_2$ ion were an acceleration energy of 25 keV and a dose of $2\times10^{15}/cm^2$. This state is shown in FIG. 6.

The thus prepared semiconductor substrate shown in FIG. 6 was subjected to a heat treatment for activation of implanted ion at 950° C. for 10 sec. Then, a Co film was deposited thinly on the whole surface by a sputtering method, and silicidization was carried out by a short-period anneal at 500° C. The unreacted Co film was removed by a mixed liquid of hydrochloric acid and hydrogen peroxide, thereby selectively leaving a Co silicide film 11 at the portions where the Si substrate is exposed. This condition was followed by a short-period heat treatment at 800° C., thereby reducing the resistance of the Co silicide film 11. Then, a thick silicon oxide film was deposited on the whole surface, and the surface of the silicon oxide film was flattened by mechanical-chemical polishing to obtain a surface protective insulation film 12. Holes were opened in desired regions of the surface protective insulation film 12, and a TiN film as a diffusion barrier material for wiring metal and a W film as the wiring metal were deposited. Then, flattening polishing was carried out to selectively leave the W film only at the opening portions. Thereafter, a metallic film consisting mainly of aluminum was deposited and patterned according to a desired circuit design, to provide a wiring including a drain electrode 14 and a source electrode 13, thereby fabricating a MOS. The thus completed state is shown in FIG. 1.

The MOS based on this embodiment showed an enlarged current per 1 μm channel width of 0.48 mA, not less than 30% larger than that of a conventional MOS transistor measured for the same gate length of 100 nm and under the same measurement conditions. The conventional MOS transistor showed a source-drain current $I_{ds}$ per 1 μm channel width of 0.37 mA under the condition where the drain applied voltage and an applied voltage obtained by subtracting the threshold voltage $V_{th}$ from the gate voltage $V_g$, $(V_g-V_T)$ are −1.5 V.

The drastic increase in current is considered to be due to a remarkable reduction of the resistance of source and drain shallow junction diffusion layers. Namely, in the conventional MOS, the sheet resistance of the source and drain shallow junction diffusion layers was as high as 6.4 kΩ/□; on the other hand, in the MOS based on the present embodiment, the resistance of the source and drain shallow junction diffusion layers was as low as 360 Ω/□.

Incidentally, $V_{th}$ value of the miniaturized MOS based on this embodiment was 0 V at a drain voltage of 1.5 V. Furthermore, as to the $V_g$ dependency of $I_{ds}$ of the miniaturized MOS based on the present invention, the difference in the threshold voltage between the case of a drain applied voltage of −1.5 V and the case of a drain applied voltage of −0.5 V is as small as 0.15 V. Namely, it is clearly shown that the present embodiment is excellent in drain induced barrier lowering (DIBL) characteristics. This also clearly shows that the source and drain diffusion layers beneath the gate electrode in the miniaturized MOS based on the invention have a sufficiently shallow junction, thereby restraining the punch-through phenomenon sufficiently.

While the case of PMOS has been described in the present embodiment, the essence of the embodiment may be applied to NMOS of the reverse conductive type, and also to CMOS which is a combination of PMOS and NMOS.

In the present embodiment, the device was fabricated by varying the In dose as a parameter, and it has been found that a crystal defect based on implantation of a heavy ion is generated where the In dose is not less than $5\times10^{19}/cm^3$. The crystal defect is localized in the inside of the high concentration diffusion layer, and does not produce electrical bad effects. However, generation of crystal defects is not desirable, and, therefore, the dose is preferably not more than $5\times10^{19}/cm^3$. Besides, the lower limit of the dose is preferably not less than $5\times10^{17}/cm^3$, because the effect of the present embodiment is sufficiently conspicuously observed where the dose is not less than $5\times10^{17}/cm^3$. From the viewpoint of reducing the resistance of the source and drain shallow junction diffusion layers, the maximum impurity concentration is preferably not less than $1 \times 10^{20}/cm^3$.

Embodiment 2

Figure 7:
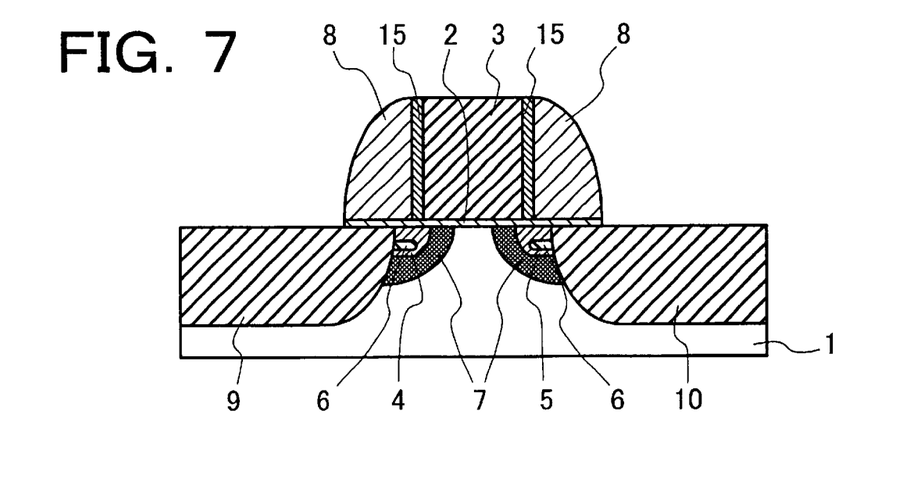
FIG. 7 is a sectional view showing a fabrication step of a MOS type field effect transistor according to a second embodiment of the present invention.
Figure 8:
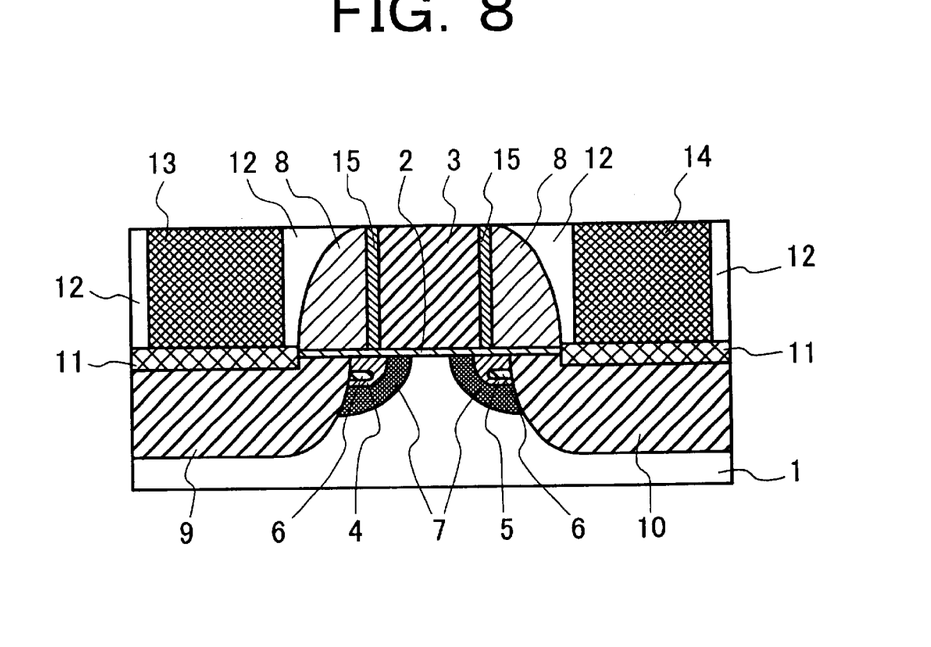
FIG. 8 is a sectional view of the MOS type field effect transistor according to the second embodiment of the present invention.

FIG. 8 is a sectional view of a completed MOS according to a second embodiment of the present invention, and FIG. 7 is a sectional view of a device showing a fabrication step.

Fabrication steps were carried out to obtain a state shown in FIG. 5 with the same specifications as in Embodiment 1, except that the ion implantation step for forming the shallow source diffusion layer 4 and the shallow drain diffusion layer 5 and the ion implantation step for forming the impurity attraction regions 6 were carried out in the reverse order as compared with Embodiment 1. Starting from the state of FIG. 5, an oxide film having a thickness of 10 nm was formed on the whole surface. Then, the oxide film was subjected to anisotropic etching to selectively leave offset insulation films 15 only at side wall portions of the gate electrode 3. With the offset insulation films 15 as mask regions for ion implantation, P ion implantation was carried out under the same conditions as in Embodiment 1, to provide N conductive type punch-through stopping diffusion layers 7 for prevention of punch-through. Thereafter, gate side wall insulation films 8, a P type high concentration drain diffusion layer 10 and a P type high concentration source diffusion layer 9 were provided in the same manner as in Embodiment 1. This state is shown in FIG. 7.

Starting from the state of FIG. 7, a heat treatment for activation of implanted ions is carried out in the same manner as in Embodiment 1. Further, a Co silicide film 11 is selectively provided, and is subjected to a treatment for reducing the resistance thereof. Then, a surface protective insulation film 12 is deposited, and holes are opened in desired regions of the surface protective insulation film 12. A TiN film and a W film as a wiring metal were deposited, and were selectively left. Thereafter, a metallic film consisting mainly of aluminum is deposited and patterned according to a desired circuit design, to provide a wiring including a drain electrode 14 and a source electrode 13, thereby fabricating a MOS. A sectional view of this state is shown in FIG. 8.

In the MOS based on this embodiment, the current value per unit gate width could be increased as compared with a conventional MOS, in the same manner as in Embodiment 1. Further, according to this embodiment, the current value per unit gate width could be increased as compared even with the MOS according to Embodiment 1. Namely, the current value was 0.52 mA as measured under the same conditions as in Embodiment 1. The N conductive type punch-through stopping diffusion layers 7 are introduced also to substrate surface regions with an offset from ends of the gate electrode, so that the N conductive type concentration in the channel region is slightly reduced. Therefore, it is inferred that, in this embodiment, the effect of impurity concentration dependency of mobility is improved and an increased current was achieved accordingly.

While ion species for forming the shallow source diffusion layer 4, the shallow drain diffusion layer 5 and high concentration diffusion layers 9 and 10 of the P conductive type was formed by $BF_2$ ion implantation in this embodiment and Embodiment 1, other ion species such as B may be used without any trouble. Furthermore, P used for forming the N conductive type punch-through stopper diffusion layers 7 may be replaced by other N conductive type impurity such as As and Sb.

The order of the ion implantation step for forming the shallow source and drain diffusion layers 4, 5 and the ion implantation step for forming the impurity attraction regions 6 is reversed in this embodiment as compared with Embodiment 1, and the electrical characteristics obtained show that the source and drain diffusion layers with extremely shallow junction and low sheet resistance could be achieved independently of the order of the ion implantation steps.

This fact evidences that the shallower junction was not achieved because the substrate surface is made amorphous by the ion implantation for forming the impurity attraction regions 6 and the channeling phenomenon at the time of ion implantation is thereby suppressed. Namely, the technique for forming a shallower junction according to this embodiment is based on a phenomenon quite different from the conventionally proposed technique of amorphusizing the substrate surface by Ge or the like for forming a shallower junction, and the effect of the phenomenon promises controlled integration of even the high concentration distribution regions.

While the case of PMOS has been described in this embodiment, the essence of the embodiment can be applied to NMOS of the opposite conductive type and to CMOS which is a combination of PMOS and NMOS.

Embodiment 3

Figure 9:
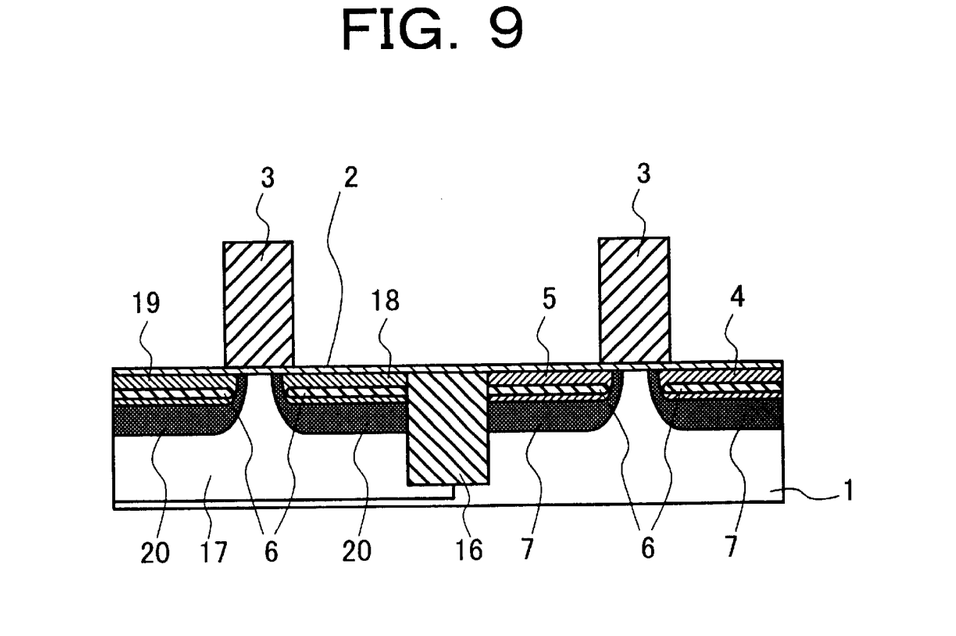
FIG. 9 is a sectional view showing a fabrication step of a MOS type field effect transistor according to a third embodiment of the present invention.
Figures 10, 11:
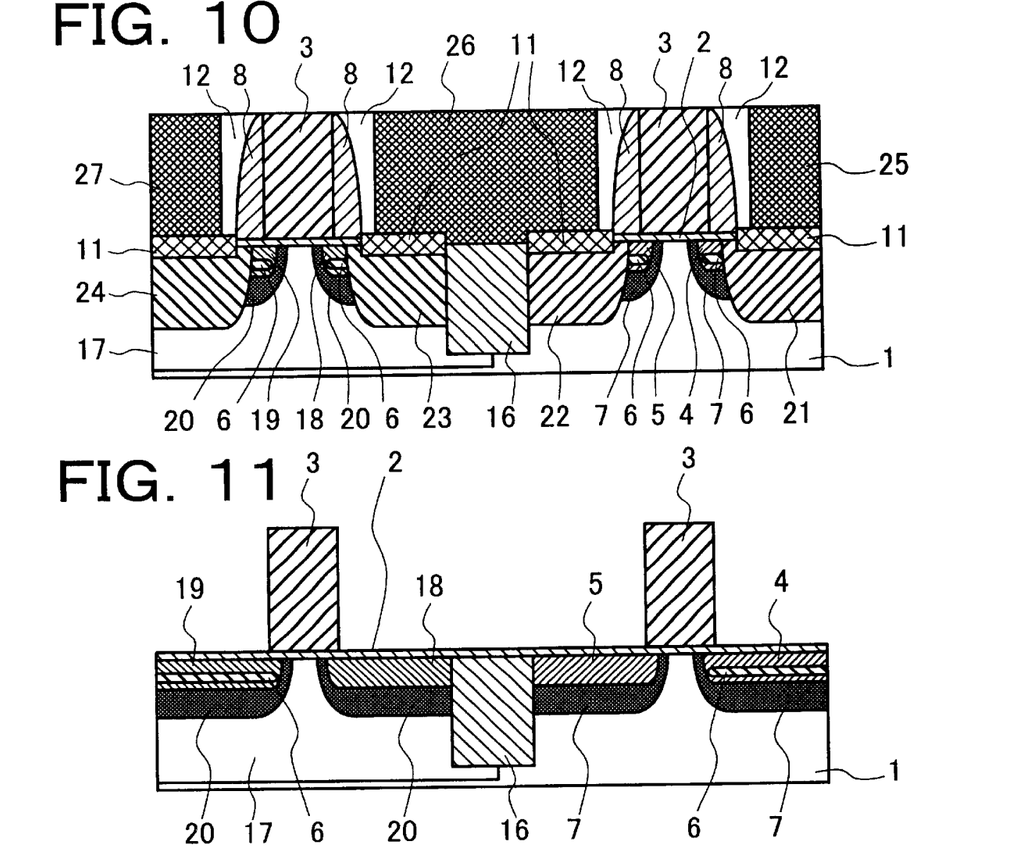
FIG. 10 is a sectional view of the MOS type field effect transistor according to the third embodiment of the present invention.
FIG. 11 is a sectional view showing a fabrication step of a MOS type field effect transistor according to a fourth embodiment of the present invention.

FIG. 10 is a sectional view of a completed MOS according to a third embodiment of the present invention, and FIG. 9 is a sectional view of the device showing a fabrication step.

A semiconductor substrate 1 having the same specifications as that used in Embodiment 1 is provided with a device separating insulation region 16 which defines active regions. Next, ion implantation for forming a P conductive type well region 17, an N conductive type ion implantation for control of concentration in an N conductive type substrate region, ion implantation for control of threshold voltage in P conductive type and N conductive type substrate near-surface regions, and a heat treatment for activation of implanted ions were carried out according to conventional techniques. Thereafter, a gate insulation film 2 and a gate electrode 3 were formed by the same method as in Embodiment 1. Next, surface regions other than the N conductive type substrate region were covered with a photoresist film, and $BF_2$ ion was thereby implanted selectively into the region, to provide a shallow source diffusion layer 4 and a shallow drain diffusion layer 5 of the P conductive type with high concentration. The conditions for forming these diffusion layers were the same as in Embodiment 1. The photoresist is omitted in the figure.

Further, P ion was implanted so as to surround the shallow source diffusion layer 4 and the shallow drain diffusion layer 5, thereby forming N conductive type punch-through stopper diffusion layers 7 for preventing punch-through. Thereafter, the photoresist used as an ion implantation screen mask was selectively removed, other areas than the P conductive type well region 17 were covered with a photoresist film (not shown), and As ion was selectively implanted only into the P conductive type well region 17, thereby forming a shallow source diffusion layer 19 and a shallow drain diffusion layer 18 of the N conductive type with high concentration. The conditions for As ion implantation were an acceleration energy of 5 keV and a dose of $2 \times 10^{15}/cm^2$.

Furthermore, B ion was implanted so as to surround the shallow source diffusion layer 19 and the shallow drain diffusion layer 18, thereby forming P conductive type punch-through stopper diffusion layers 20 for preventing punch-through. After the photoresist used for selective ion implantation was removed, In ion was implanted over the whole surface to provide impurity attraction regions 6 so that a maximum concentration depth is located in the inside of the P and N conductive type source and drain diffusion layers 4, 5, 18 and 19. The conditions for the In ion implantation were an acceleration energy of 10 keV and a dose of $2\times10^{12}/cm^2$. After the formation of the impurity attraction regions 6, a heat treatment was carried out at 950° C. for 5 sec to activate the implanted ions. The heat treatment may be carried out before the implantation of In ion, without any difference in the results. This state is shown in the sectional view of FIG. 9.

Starting from the state of FIG. 9, gate side wall insulation films 8 were formed according to the fabrication steps in Embodiment 1. Thereafter, the surface region of the N conductive type substrate was again covered with a photoresist film (not shown), and, with the photoresist film and the side wall insulation films 8 as an implantation screen mask, As ion was implanted at an acceleration energy of 50 keV and a dose of $3\times10^{15}/cm^2$, to form a deep high concentration source diffusion layer 24 and a deep high concentration drain diffusion layer 23.

After the photoresist film used as the ion implantation mask was removed, the P conductive type well region 17 was again covered with a photoresist film (not shown), and, with the photoresist film and the side wall insulation films 8 as an implantation mask, B ion was implanted at an acceleration energy of 5 keV and a dose of $2\times10^{15}/cm^2$, to form a deep high concentration source diffusion layer 21 and a deep high concentration drain diffusion layer 22. Then, a heat treatment for activation of implanted ions was carried out at 950° C. for 10 sec.

Subsequently, selective formation of a Co silicide film 11 and reduction of the resistance thereof, deposition of a surface protective insulation film 12 and opening of holes at desired regions thereof, and deposition and selective leaving of a TiN film and a W film as a wiring metal were carried out according to the same fabrication method as in Embodiment 1. Then, a metallic film consisting mainly of aluminum was deposited and patterned according to a desired circuit design, to form a wiring including a drain electrode 26 and source electrodes 25 and 27, thereby fabricating a MOS. A sectional view of the thus completed device is shown in FIG. 10.

In the present embodiment, devices were fabricated under various conditions by varying the In dose as a parameter. Where the In dose is not less than $5\times10^{19}/cm^3$, a crystal defect based on implantation of a heavy ion is generated. The crystal defect is localized in the high concentration diffusion layer, and would not directly make an electrical bad effect; however, generation of crystal defect is not preferable, so that the In dose is preferably not more than $5\times10^{19}/cm^3$. The lower limit of the In dose is preferably not less than $5\times10^{17}/cm^3$, because the effect of the present embodiment is observed where the In dose is not less than $5\times10^{17}/cm^3$. From the viewpoint of reducing the resistance of the source and drain shallow junction diffusion layers, the maximum impurity concentration is preferably not less than $1\times10^{20}/cm^3$.

Based on the fabrication steps as above, a CMOS is fabricated. In the MOS based on the present embodiment, an increased current was achieved with the PMOS in the same manner as in Embodiment 1, and, at the same time, an increased current was achieved also with the NMOS. Namely, a conventional NMOS with a gate length of 100 nm showed a source-drain current $I_{ds}$ per 1 μm channel width of 0.85 mA under the condition where a drain applied voltage and an applied voltage obtained by subtracting a threshold voltage $V_{th}$ from the gate voltage $V_g$ ($V_g-V_T$) were 1.5 V, and, on the other hand, the NMOS based on the present embodiment showed a 20% up large current of 1.05 mA with the same gate length and under the same measurement conditions.

It is inferred that the above-mentioned drastic increase of the current is due to a reduction of resistance of the source and drain shallow junction diffusion layers; namely, the sheet resistance of the source and drain shallow junction diffusion layers in the conventional NMOS was as high as 350 Ω/□, whereas the sheet resistance of the source and drain shallow junction diffusion layers in the NMOS based on this embodiment was as low as 240 Ω/□. Namely, based on the present embodiment, it is possible to increase the current of the NMOS and PMOS constituting a miniaturized CMOS, easily by only adding an ion implantation step to the conventional CMOS fabrication steps.

Incidentally, evaluation was also conducted with the case where, in FIG. 9 of the present embodiment, the ion implantation step for forming the impurity attraction regions 6 was carried out over the whole surface of the N conductive type substrate surface region and the P conductive type well region 17 by using the gate electrode as an implantation mask, after the formation of the gate electrode 3 and before the ion implantation for forming the shallow source diffusion layer 4 and the shallow drain diffusion layer 5 of the P conductive type with high concentration. In this case, the change in the order of ion implantations made no observable influence on the characteristics of the MOS fabricated. Therefore, any order may be used with respect to ion implantations, and the present invention is independent of the order of the steps.

While an example of introducing the punch-through stopping diffusion layer by using the gate electrode 3 as an implantation mask region has been described in this embodiment, offset insulation films may be provided at the side walls of the gate electrode and may be used as an implantation mask. In that case, there is an effect that the implantation position relative to the gate electrode can be set at a desired location by controlling the thickness of the offset film.

Embodiment 4

Figure 12:
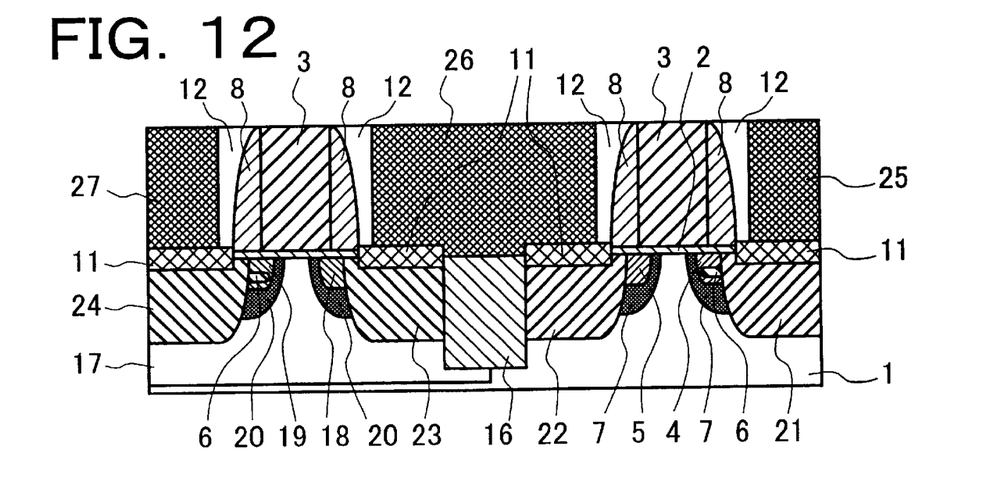
FIG. 12 is a sectional view of the MOS type field effect transistor according to the fourth embodiment of the present invention.

FIG. 12 is a sectional view of a completed MOS according to a fourth embodiment of the present invention, and FIG. 11 is a sectional view showing a fabrication step.

In the present embodiment, a MOS was fabricated primarily according to Embodiment 3, except for ion implantation conditions for forming shallow source and drain junctions; namely, for both P conductive type and N conductive type, ion dose was set at $5\times10^{14}/cm^2$. Further, in forming impurity attraction regions 6, the regions of shallow drain junctions 18 and 5 were selectively covered with a photoresist film, and then In ion implantation was carried out under the same conditions as described in Embodiment 3. Thereafter, the photoresist was removed, and a heat treatment for activation of implanted ions was carried out according to the method of Embodiment 3. A sectional view of the device showing this state is FIG. 11.

After the state of FIG. 11, selective forming of a Co silicide film 11 and reduction of the resistance thereof, deposition of a surface protective insulation film 12 and opening of holes at desired regions of the insulation film 12, and deposition and selective leaving of a TiN film and a W film as a wiring metal were carried out primarily according to Embodiment 3. Thereafter a metallic film consisting mainly of aluminum was deposited and patterned according to a desired circuit design, to form a wiring including a drain electrode 26 and source electrodes 25 and 27, thereby fabricating a MOS. A sectional view of the thus completed state is FIG. 12.

A CMOS is fabricated based on the above fabrication steps. In the MOS based on this embodiment, the shallow drain junctions 5 and 18 in both PMOS and NMOS have the same impurity distribution as that based on the conventional fabrication method, and the impurity concentration was set to be lower than the shallow drain junction in the MOS based on Embodiment 3. Accordingly, the sheet resistance was as high as about 7 k$\Omega$/□ in PMOS and as high as about 1 k$\Omega$/□ in NMOS.

On the other hand, although the impurity concentration in the shallow source junction was set to be lower than in the shallow source junction in the MOS based on Embodiment 3, the sheet resistance was as low as about 600 $\Omega$/□ in PMOS and as low as about 350 $\Omega$/□ in NMOS. It is considered that this is because the implanted impurity inactivated due to segregation at the interface between the substrate surface and the gate insulation film is effectively activated by the introduction of the impurity attraction regions 6.

Namely, based on the present embodiment, relaxation of electric field by an enhanced resistance on the side of the drain diffusion layer to which a high electric field is impressed and a reduction in resistance on the side of the source diffusion layer were achieved. By this, both relaxation of the drain electric field indispensable to enhancement of performance of the miniaturized MOS, namely, improvement of punch-through characteristics and a reduction in source resistance indispensable to realization of larger current were achieved by the MOS fabricated according to the present embodiment.

Incidentally, while an example of introducing the punch-through stopping diffusion layer 20 by using the gate electrode 3 as an implantation mask has been described in this embodiment, offset insulation films may be provided at side walls of the gate electrode and be used as an implantation mask. In that case, there is obtained an effect that the introduction position relative to the gate electrode can be set at a desired location by controlling the thickness of the offset films.

Embodiment 5

Figure 13:
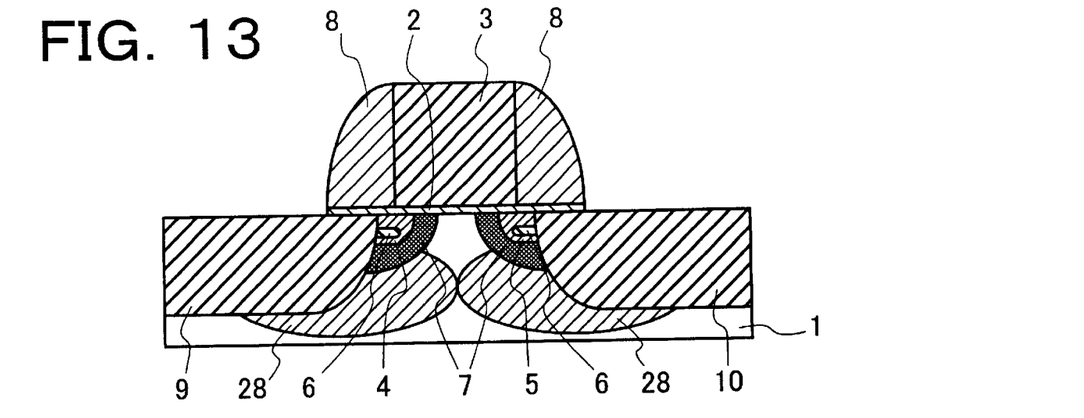
FIG. 13 is a sectional view showing a fabrication step of a MOS type field effect transistor according to a fifth embodiment of the present invention.
Figure 14:
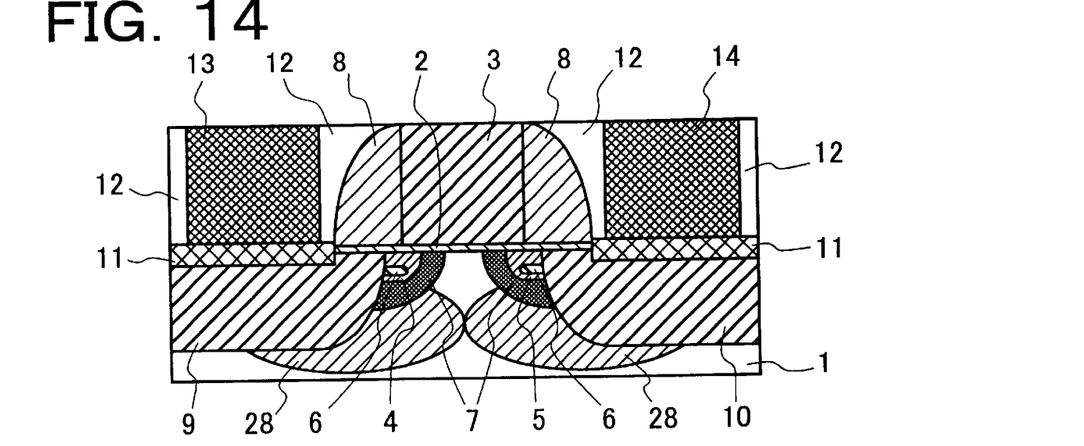
FIG. 14 is a sectional view of the MOS type field effect transistor according to the fifth embodiment of the present invention.

FIG. 14 is a sectional view showing a completed MOS according to a fifth embodiment of the present invention, and FIG. 13 is a sectional view showing a fabrication step.

In the present embodiment, a MOS was fabricated primarily according to the method of Embodiment 1, but, before or after the formation of the N conductive type punch-through stopping diffusion layers 7 in Embodiment 1, P ion was implanted in this embodiment at a high energy so as to form second N conductive type punch-through stopping diffusion layers 28 to be located on the deep side of the N conductive type punch-through stopping diffusion layers 7. The ion implanted may be As or Sb. In this embodiment, the implantation of an N conductive type ion for adjusting substrate concentration after formation of the device separating insulation region and a heat treatment for extending the implanted ion as carried out in Embodiment 1 were not conducted. After the formation of second N conductive type punch-though stopping diffusion layers 28, gate side wall insulation films 8, a P type high concentration drain diffusion layer 10 and a P type high concentration source diffusion layer 9 were formed according to Embodiment 1. A sectional view showing this state is FIG. 13.

Starting from the state of FIG. 13, a heat treatment for activation of implanted ions, selective formation of a Co silicide film 11 and reduction of the resistance thereof, deposition of a surface protective insulation film 12 and opening of holes at desired regions thereof, and deposition and selective leaving of a TiN film and a W film as a wiring metal were carried out according to Embodiment 1. Thereafter, a metallic film consisting mainly of aluminum was deposited and patterned according to a desired circuit design, to form a wiring including a drain electrode 14 and a source electrode 13, thereby fabricating a MOS. A sectional view of the thus completed state is FIG. 14.

In the MOS based on this embodiment, the N conductive type impurity for adjusting substrate concentration can be introduced after formation of the gate insulation film 2, and, therefore, the effect on enhanced diffusion of interstitial Si generated in a high temperature oxidizing atmosphere could be precluded. In addition, the phenomenon of a rise in surface impurity concentration due to reaching of the impurity introduced into the inside of substrate to the surface of the substrate could be dissolved. By this, the impurity distribution could be so set as to obtain an extremely low concentration at the surface and a high concentration in the inside of the substrate, resulting in that a high mobility was realized and the punch-through stopping characteristics could be improved even as compared with the MOS based on Embodiment 1.

Furthermore, based on the present embodiment, the photoresist step for selective formation of a well region can be omitted, and, therefore, a miniaturized MOS can be provided economically. While an example of introducing the second N conductive type punch-through stopping diffusion layers 28 by using the gate electrode 3 as an implantation mask has been described in this embodiment, offset insulation films may be provided at side walls of the gate electrode and may be used as an implantation mask. In that case, there is obtained an effect that the introduction position relative to the gate electrode can be set at a desired location by controlling the thickness of the offset films. Further, while the case of PMOS has been described in this embodiment, the essence of the embodiment may be applied to an NMOS of the opposite conductive type and to a CMOS which is a combination of PMOS and NMOS.

Embodiment 6

Figure 15:
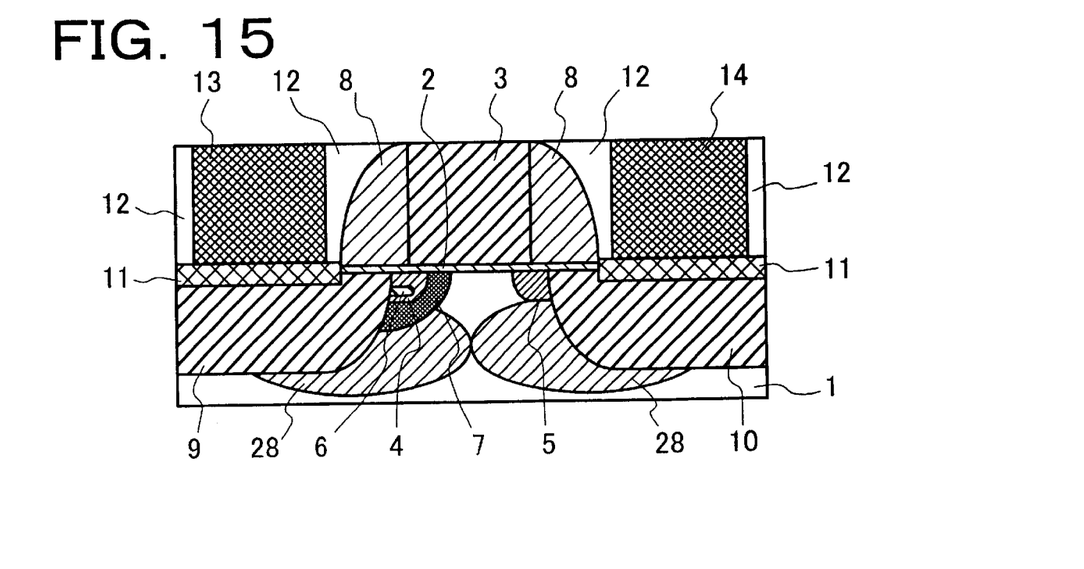
FIG. 15 is a sectional view showing a fabrication step of a MOS type field effect transistor according to a sixth embodiment of the present invention.

FIG. 15 is a sectional view showing a completed MOS according to a sixth embodiment of the present invention.

In the present embodiment, a MOS was fabricated primarily according to Embodiment 5, but ion implantation for forming shallow source and drain junctions was carried out with an ion dose of $5\times10^{14}$/cm$^2$. Further, in forming an impurity attraction region 6, the region of the shallow drain junction 5 was selectively covered with a photoresist film and then In ion implantation was carried out based on the method of Embodiment 5. Thereafter, the photoresist film was removed, and a heat treatment for activation of implanted ions was carried out according to Embodiment 5. Starting from this state, selective formation of a Co silicide film 11 and reduction of the resistance thereof, deposition of a surface protective insulation film 12 and opening of holes at desired regions thereof, and formation and selective leaving of a TiN film and a W film as a wiring metal were carried out primarily according to the method of Embodiment 5. Thereafter, a metallic film consisting mainly of aluminum was deposited and patterned according to a desired circuit design, to form a wiring including a drain electrode 14 and a source electrode 13, thereby fabricating an MOS.

In the MOS based on this embodiment, the shallow drain junction 5 has an impurity distribution based on the conventional fabrication method, and the impurity concentration was set to be lower than that of the shallow drain junction in the MOS based on Embodiment 5, so that the sheet resistance was as high as about 7 kΩ/□. On the other hand, although the impurity concentration in the shallow source junction was set to be lower than that in the shallow source junction of the MOS based on Embodiment 5, the sheet resistance was as low as about 600 Ω/□. This is considered to be because the implanted impurity inactivated by segregation at the interface between the substrate surface and the gate insulation film was effectively activated by the introduction of the impurity attraction region 6.

Namely, based on the present embodiment, both relaxation of electric field by an increase in resistance on the side of the drain diffusion layer to which a strong field is applied and a reduction in the resistance on the side of the source diffusion layer were further improved even as compared with the MOS based on Embodiment 5. By this, relaxation of drain field indispensable to enhancement of performance of the miniaturized MOS, namely, an improvement of punch-through stopping characterisitics and a reduction of source resistance indispensable to an increase of current were both achieved by the MOS fabricated based on the present embodiment. Incidentally, while the case of PMOS has been described in this embodiment, the essence of the embodiment may be applied to NMOS of the reverse conductive type and to CMOS which is a combination of PMOS and NMOS. While an example of introducing the punch-through stopping diffusion layers 7 and 28 by using the gate electrode 3 as an implantation mask has been described in this embodiment, offset insulation films may be provided at side walls of the gate electrode 3 and be used as an implantation mask. In that case, there is obtained an effect that the introduction position relative to the gate electrode can be set at a desired location by controlling the thickness of the offset film.

As has been described in detail above, according to the present invention, a lower sheet resistance and extremely shallow junctions can be obtained while realizing a high concentration rectangular impurity distribution in the shallow source and drain junctions beneath the gate electrode which are called extensions. Therefore, excellent punch-through stopping characteristics and a larger current can be achieved in a miniaturized MOS. Although the present invention is particularly effective to achieve a larger current in PMOS, it can be applied also to NMOS, so that a larger current and a shorter channel can be achieved in CMOS by only adding one ion implantation step, namely, economically.

Besides, according to the present invention, introduction of a high concentration substrate impurity region in the vicinity of a drain junction in the semiconductor surface region superimposed on the gate electrode can be obviated, so that $N^+P^+$ high concentration tunnel junction is not formed, and leakage current in a holding condition due to GIDL phenomenon can be reduced, and, accordingly, a reduction in power consumption can be realized.

According to a primary mode of the present invention, it is possible to provide an insulated gate field effect transistor realizing both a reduction in junction depth and a reduction in resistance of the source and drain junction regions beneath the gate electrode.

According to another mode of the present invention, it is possible to provide a miniaturized complementary type insulated gate field effect transistor capable of operating with a large current and a high speed.

To facilitate understanding of the drawings, explanations of major symbols will be enumerated below.

1: semiconductor substrate; 2: gate insulation film; 3: gate electrode; 4: shallow source diffusion layer; 5: shallow drain diffusion layer; 6: impurity attraction region; 7: punch-through stopping diffusion layer; 8: gate side wall insulation film; 9: high concentration source diffusion layer; 10: high concentration drain diffusion layer; 11: silicide film; 12: surface protective insulation film; 13: source electrode; 14: drain electrode; 15: offset insulation film; 16: device separating insulation region; 17: P conductive type well region; 18: shallow drain diffusion layer; 19: shallow source diffusion layer; 20: punch-through stopping diffusion layer; 21, 24: high concentration source diffusion layer; 22, 23: high concentration drain diffusion layer; 25, 27: source electrode; 26: drain electrode; 28: well diffusion layer.

What is claimed is:

1. An insulated gate field effect transistor comprising:

a PN junction at a portion of a main surface region of a semiconductor substrate of a first conductivity type, said PN junction formed by a high concentration first impurity region of a second conductivity type demarcated by a deep junction and a shallow junction, said high concentration first impurity region so constituted as to have a maximum concentration at the surface of said semiconductor substrate, and a second impurity region distributed in the inside of said high concentration first impurity region constituting said shallow junction region of said second conductivity type, said second impurity region having a maximum concentration in the inside of said semiconductor substrate and having a maximum concentration lower than the maximum impurity concentration of said high concentration first impurity region, wherein the maximum concentration of said high concentration first impurity region constituting said shallow junction region is not less than $1 \times 10^{20}$ cm$^{-3}$, and the maximum impurity concentration of said second impurity region is not more than $5 \times 10^{19}$ cm$^{-3}$.

2. An insulated gate field effect transistor comprising:

a PN junction at a portion of a main surface region of a semiconductor substrate of a first conductivity type, said PN junction formed by a high concentration first impurity region of a second conductivity type demarcated by a deep junction and a shallow junction, said high concentration first impurity region so constituted as to have a maximum concentration at the surface of said semiconductor substrate, and a second impurity region distributed in the inside of said high concentration first impurity region constituting said shallow junction region of said second conductivity type, said second impurity region having a maximum concentration in the inside of said semiconductor substrate and having a maximum concentration lower than the maximum impurity concentration of said high concentration first impurity region, wherein the impurity constituting said second impurity region is In, and wherein said high concentration first impurity region constituting said shallow junction region comprises As or B.

3. A complementary metal-oxide semiconductor device, wherein a first conductivity type region and a second conductivity type region are provided at main surface portions of the sane semiconductor substrate, a second conductivity type insulated gate field effect transistor comprising a PN junction formed by a high concentration impurity region of the second conductivity type demarcated by a deep junction and a shallow junction is provided in said first conductivity type region, whereas a first conductivity type insulated gate field effect transistor comprising a PN junction formed by a high concentration impurity region of a first conductivity type demarcated by a deep junction and a shallow junction is provided in said second conductivity type region, and a second conductivity type impurity region having a maximum concentration in the inside of said semiconductor substrate is provided in each of said high concentration impurity regions constituting said shallow junctions of both of said second conductivity type and said first conductivity type.

4. A complementary metal-oxide semiconductor device as set forth in claim 3, wherein the maximum impurity concentration of said first and second conductivity type high concentration impurity regions constituting said shallow junction regions is not less than $1 \times 10^{20}$ cm$^{-3}$, and the maximum impurity concentration of said second conductivity type impurity region is not more than $5 \times 10^{19}$ cm$^{-3}$.

5. A complementary metal-oxide semiconductor device as set forth in claim 3, wherein the impurity constituting said second conductivity type impurity region is In.

6. A complementary metal-oxide semiconductor device as set forth in claim 5, wherein said high concentration impurity regions constituting said shallow junction regions are constituted of As and B.

7. A complementary metal-oxide semiconductor device as set forth in claim 5, wherein said high concentration impurity region constituting said deep junction and said shallow junction is a source region and a drain region.

8. A complementary metal-oxide semiconductor device as set forth in claim 7, wherein an impurity region of a conduction type opposite to that of said source region is provided so as to surround said source region having said shallow junction and to have a maximum impurity concentration at said shallow source junction depth.

9. A complementary metal-oxide semiconductor device as set forth in claim 5, wherein said high concentration impurity region constituting said deep junction and said shallow junction is a source region.

10. A complementary metal-oxide semiconductor device as set forth in claim 9, wherein an impurity region of a conduction type opposite to that of said source region is provided so as to surround said source region having said shallow junction and to have a maximum impurity concentration at said shallow source junction depth.

* * * * *